US011462568B2

(12) United States Patent
Lilak et al.

(10) Patent No.: US 11,462,568 B2
(45) Date of Patent: Oct. 4, 2022

(54) STACKED THIN FILM TRANSISTORS

(71) Applicant: Intel Corporation, Santa Clara, CA (US)

(72) Inventors: Aaron Lilak, Beaverton, OR (US); Justin Weber, Portland, OR (US); Harold Kennel, Portland, OR (US); Willy Rachmady, Beaverton, OR (US); Gilbert Dewey, Beaverton, OR (US); Van H. Le, Portland, OR (US); Abhishek Sharma, Hillsboro, OR (US); Patrick Morrow, Portland, OR (US); Ashish Agrawal, Hillsboro, OR (US)

(73) Assignee: Intel Corporation, Santa Clara, CA (US)

(*) Notice: Subject to any disclaimer, the term of this patent is extended or adjusted under 35 U.S.C. 154(b) by 958 days.

(21) Appl. No.: 16/016,387

(22) Filed: Jun. 22, 2018

(65) Prior Publication Data
US 2019/0393249 A1    Dec. 26, 2019

(51) Int. Cl.
| | | |
|---|---|---|
| H01L 27/12 | (2006.01) | |
| H01L 21/8256 | (2006.01) | |
| H01L 29/78 | (2006.01) | |
| H01L 29/786 | (2006.01) | |

(52) U.S. Cl.
CPC ...... *H01L 27/1211* (2013.01); *H01L 21/8256* (2013.01); *H01L 29/785* (2013.01); *H01L 29/7869* (2013.01)

(58) Field of Classification Search
CPC ............ H01L 27/1211; H01L 21/8256; H01L 29/785; H01L 29/7869; H01L 27/0688; H01L 27/0886; H01L 27/1225; H01L 27/1251

See application file for complete search history.

(56) References Cited

U.S. PATENT DOCUMENTS

| | | | | |
|---|---|---|---|---|
| 7,479,673 B2* | 1/2009 | Jang | ..................... | H01L 27/1108 438/153 |
| 7,719,033 B2* | 5/2010 | Jeong | ................... | H01L 27/0688 257/70 |
| 7,999,297 B2* | 8/2011 | Yang | .................... | H01L 27/0688 257/532 |
| 2009/0020817 A1* | 1/2009 | Park | .................... | H01L 21/8221 438/153 |
| 2013/0258746 A1* | 10/2013 | Kurokawa | .......... | H01L 27/0688 365/72 |
| 2018/0254351 A1* | 9/2018 | Jung | ..................... | H01L 27/124 |

* cited by examiner

*Primary Examiner* — Jonathan Han
(74) *Attorney, Agent, or Firm* — Schwabe, Williamson & Wyatt P.C.

(57) ABSTRACT

Embodiments herein describe techniques for a semiconductor device including a first transistor above a substrate, an insulator layer above the first transistor, and a second transistor above the insulator layer. The first transistor includes a first channel layer above the substrate, and a first gate electrode above the first channel layer. The insulator layer is next to a first source electrode of the first transistor above the first channel layer, next to a first drain electrode of the first transistor above the first channel layer, and above the first gate electrode. The second transistor includes a second channel layer above the insulator layer, and a second gate electrode separated from the second channel layer by a gate dielectric layer. Other embodiments may be described and/or claimed.

20 Claims, 9 Drawing Sheets

STACKED THIN FILM TRANSISTORS

FIELD

Embodiments of the present disclosure generally relate to the field of integrated circuits, and more particularly, to transistors.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

A thin-film transistor (TFT) is a kind of field-effect transistor including a channel layer, a gate electrode, and source and drain electrodes, over a supporting but non-conducting substrate. A TFT differs from a conventional transistor, where a channel of the conventional transistor is typically within a substrate, such as a silicon substrate. TFTs have emerged as an attractive option to fuel Moore's law by integrating TFTs vertically in the back-end of the line (BEOL), while leaving the silicon substrate areas for high-speed transistors. However, integration of TFTs may still be a problem.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

DETAILED DESCRIPTION

Figure 1:
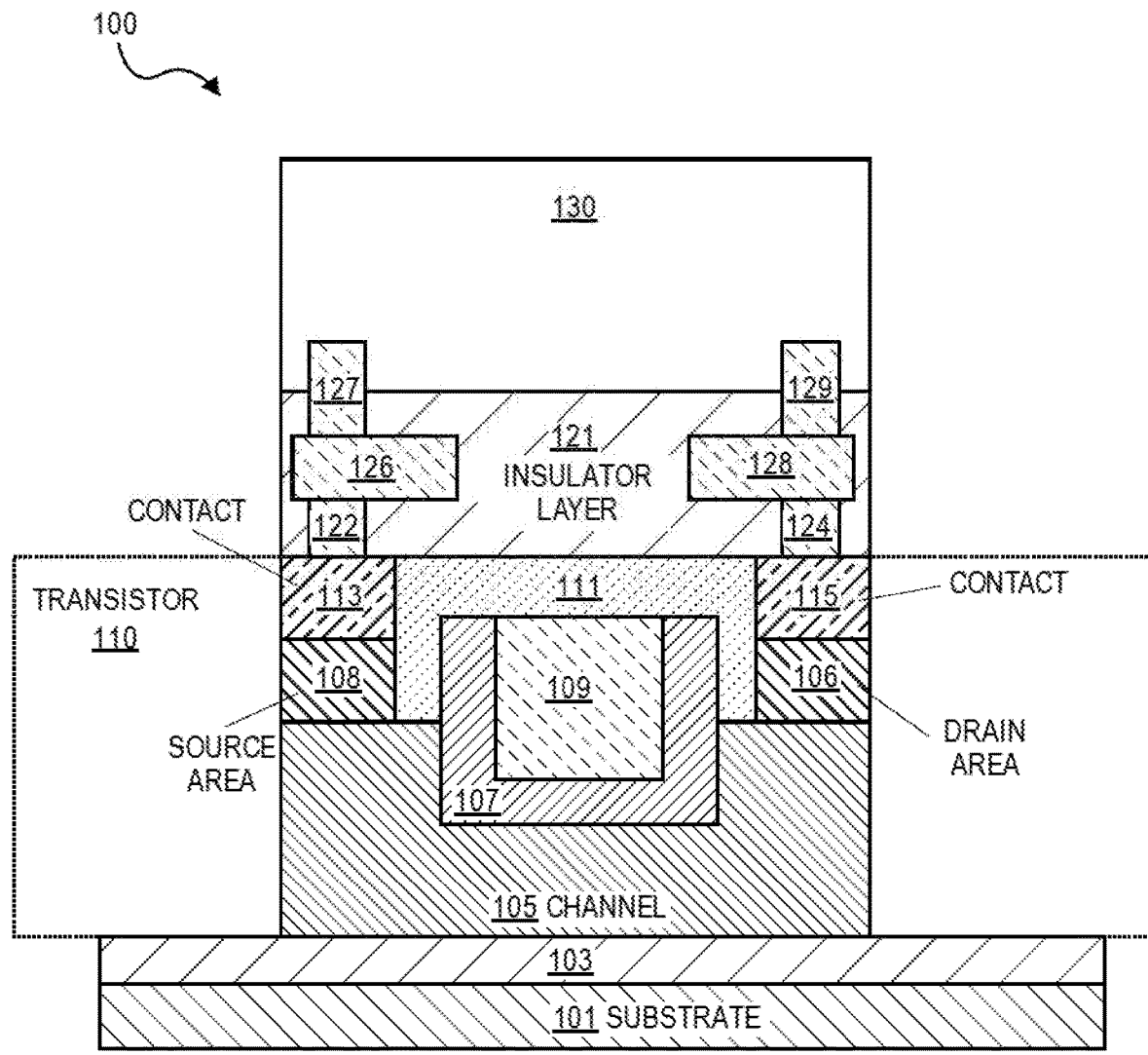
FIG. 1 schematically illustrates a diagram of an integrated circuit (IC) including a thin film transistor (TFT) stacked over another TFT, in accordance with some embodiments.

A thin-film transistor (TFT) is a kind of field-effect transistor including a channel layer, a gate electrode, and source and drain electrodes, over a supporting but non-conducting substrate. There may be various configurations for a TFT based on positions of the electrodes: top gate top electrode, top gate bottom electrode, bottom gate bottom electrode, and bottom gate top electrode. A TFT may be formed at back-end-of-line (BEOL) on a substrate, while another transistor may be formed within the substrate at the front-end-of-line (FEOL). Hence, a TFT at the BEOL may be integrated with a transistor at the FEOL. Alternatively, multiple transistors may be stacked by a layer transfer process or a silicon on insulator (SOI) wafer, where multiple substrates, e.g., silicon substrate, may be used. However, it has been difficult to integrate multiple TFTs at the BEOL on one substrate.

Embodiments herein may present techniques that integrate multiple TFTs together at the BEOL on a single substrate. Multiple TFTs may be integrated with any substrate or base material at the FEOL. One TFT may be stacked over another TFT to produce a thin and transparent assembly. To facilitate the integration of multiple TFTs at the BEOL, embodiments herein may utilize p-type amorphous semiconductor materials, e.g., $Cu_2O$, NiO, SnO, SiC, and more, to form a p-type TFT. These p-type materials may possess enough carrier mobility suitable for complementary logic used in a multiple TFT assembly. Hence, embodiments herein may implement complementary logic including both n-type TFT and p-type TFT at the BEOL on a single substrate. As a result, embodiments herein may avoid the costs associated with layer transfer or an additional substrate or bulk wafer for the layer transfer to form stacked multiple transistors.

Embodiments herein may present an integrated circuit (IC) including a first transistor above a substrate, an insulator layer above the first transistor, and a second transistor above the insulator layer. In more detail, the first transistor may include a first channel layer above the substrate, and a first gate electrode above the first channel layer. The insulator layer may be next to a first source electrode of the first transistor above the first channel layer, next to a first drain electrode of the first transistor above the first channel layer, and above the first gate electrode. In addition, the second transistor may include a second channel layer above the insulator layer, and a second gate electrode separated from the second channel layer by a gate dielectric layer.

Embodiments herein may present a method for forming an IC. The method may include: forming a first transistor above a substrate, forming an insulator layer above the first transistor, and forming a second transistor above the insulator layer. In detail, the forming the first transistor may include: forming a first channel layer above the substrate, and forming a first gate electrode above the first channel layer. The insulator layer may be next to a first source electrode of the first transistor above the first channel layer, next to a first drain electrode of the first transistor above the first channel layer, and above the first gate electrode. The forming the second transistor may include: forming a second channel layer above the insulator layer, and forming a second gate electrode separated from the second channel layer by a gate dielectric layer.

In embodiments, a computing device may include a circuit board and an IC coupled to the circuit board. The IC may include a first transistor above a substrate, an insulator layer above the first transistor, and a second transistor above the insulator layer. The first transistor may include a first channel layer above the substrate, and a first gate electrode above the first channel layer. The insulator layer may be next to a first source electrode of the first transistor above the first channel layer, next to a first drain electrode of the first transistor above the first channel layer, and above the first gate electrode. The second transistor may include a second channel layer above the insulator layer, and a second gate electrode separated from the second channel layer by a gate dielectric layer.

In the following description, various aspects of the illustrative implementations will be described using terms commonly employed by those skilled in the art to convey the substance of their work to others skilled in the art. However, it will be apparent to those skilled in the art that the present disclosure may be practiced with only some of the described aspects. For purposes of explanation, specific numbers, materials and configurations are set forth in order to provide a thorough understanding of the illustrative implementations. However, it will be apparent to one skilled in the art that the present disclosure may be practiced without the specific details. In other instances, well-known features are omitted or simplified in order not to obscure the illustrative implementations.

Various operations will be described as multiple discrete operations, in turn, in a manner that is most helpful in understanding the present disclosure. However, the order of description should not be construed to imply that these operations are necessarily order dependent. In particular, these operations may not be performed in the order of presentation.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The terms "over," "under," "between," "above," and "on" as used herein may refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature" may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

Where the disclosure recites "a" or "a first" element or the equivalent thereof, such disclosure includes one or more such elements, neither requiring nor excluding two or more such elements. Further, ordinal indicators (e.g., first, second, or third) for identified elements are used to distinguish between the elements, and do not indicate or imply a required or limited number of such elements, nor do they indicate a particular position or order of such elements unless otherwise specifically stated.

As used herein, the term "circuitry" may refer to, be part of, or include an Application Specific Integrated Circuit (ASIC), an electronic circuit, a processor (shared, dedicated, or group), and/or memory (shared, dedicated, or group) that execute one or more software or firmware programs, a combinational logic circuit, and/or other suitable hardware components that provide the described functionality. As used herein, "computer-implemented method" may refer to any method executed by one or more processors, a computer system having one or more processors, a mobile device such as a smartphone (which may include one or more processors), a tablet, a laptop computer, a set-top box, a gaming console, and so forth.

Implementations of the disclosure may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present disclosure.

A plurality of transistors, such as metal-oxide-semiconductor field-effect transistors (MOSFET or simply MOS transistors), may be fabricated on the substrate. In various implementations of the disclosure, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the disclosure may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type work function metal or N-type work function metal, depending on whether the transistor is to be a PMOS or an NMOS transistor. In some implementations, the gate electrode layer may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a work function that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a work function that is between about 3.9 eV and about 4.2 eV.

In some implementations, when viewed as a cross-section of the transistor along the source-channel-drain direction, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the disclosure, the gate electrode may consist of a combination of U-shaped structures and planar, non-U-shaped structures. For example, the gate electrode may consist of one or more U-shaped metal layers formed atop one or more planar, non-U-shaped layers.

In some implementations of the disclosure, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process operations. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process for a column IV semiconductor such as silicon, dopants such as boron, aluminum, antimony, indium, gallium, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

FIG. 1 schematically illustrates a diagram of an IC 100 including a TFT 130 stacked over another TFT 110, in accordance with some embodiments. For clarity, features of the IC 100, the TFT 110, and the TFT 130 may be described below as examples for understanding an example IC and a TFT. It is to be understood that there may be more or fewer components within an IC and a TFT. Further, it is to be understood that one or more of the components within an IC and a TFT, may include additional and/or varying features from the description below, and may include any device that one having ordinary skill in the art would consider and/or refer to as an IC and a TFT.

In embodiments, the IC 100 may include the TFT 110 above a substrate 101, an insulator layer 121 above the TFT 110, and the TFT 130 above the insulator layer 121. A dielectric layer 103 may be between the substrate 101 and the TFT 110. The TFT 110 may include a channel layer 105 above the substrate 101, a gate electrode 109 above the channel layer 105 and separated from the channel layer 105 by a gate dielectric 107. The TFT 110 may further include a source area 108 adjacent to the channel layer 105, a source electrode 113 above the source area 108, a drain area 106 adjacent to the channel layer 105, and a drain electrode 115 above the drain area 106. The source electrode 113, the drain electrode 115, and the gate electrode 109 may be embedded within an ILD layer 111. The insulator layer 121 may be next to the source electrode 113, the drain electrode 115, and above the gate electrode 109. The TFT 130 may include a channel layer above the insulator layer 121, and a gate electrode separated from the channel layer by a gate dielectric layer, not shown. In embodiments, a shadow of the transistor TFT 130 may be substantially overlapped with the TFT 110.

In embodiments, the TFT 110 and the TFT 130 may be above the substrate 101 at the BEOL of the IC 100. The TFT 110 and the TFT 130 may be separated by the insulator layer 121, without any additional substrate between them. The TFT 110 may be a p-type transistor, and the channel layer 105 may include a material selected from $CuO$, $ZnRh_2O_4$, $AlCuO_2$, $SrCu_2O_2$, $La_2SeO_2$, $Pr_2SeO_2$, $Nd_2SeO_2$, $Gd_2SeO_2$, $NiO$, $SiC$, $SnO$, $Cu2O$, or $VO_2$, or $VO_2$, or an oxide alloyed or doped with S, Se, Te, or an element to raise a valence-band of the oxide to be a doped p-type oxide. These p-type materials may possess enough carrier mobility suitable for complementary logic used in a multiple TFT assembly. Additionally and alternatively, the TFT 110 may be an n-type transistor, and the channel layer 105 may include a material selected from ZnO, CdO, $In_2O_3$, $Ga_2O_3$, $SnO_2$, IGZO, IZO, ITO, GZO, $TiO_2$, SiC, SnO, $Cu_2O$, or $VO_2$, or an oxide alloyed or doped with In, Sn, Zn, Mo, Ti, Co, Cd, to lower a conduction band of the oxide to be a doped n-type oxide. Similarly, the TFT 130 may be an n-type transistor or a p-type transistor including materials listed for the TFT 110. The TFT 110, the insulator layer 121, and the TFT 130 may form a thin and transparent assembly. Hence, embodiments herein may implement complementary logic including both n-type TFT and p-type TFT at the BEOL on a single substrate, e.g., the substrate 101.

Additionally and alternatively, in embodiments, the channel layer 105, the source area 108, the drain area 106, may include a material comprising amorphous silicon, zinc oxide, amorphous germanium, polysilicon, poly germanium doped with boron, poly germanium doped with aluminum, poly germanium doped with phosphorous, poly germanium doped with arsenic, indium oxide, tin oxide, gallium oxide, indium gallium zinc oxide (IGZO), copper oxide, nickel oxide, cobalt oxide, indium tin oxide, tungsten disulphide, molybdenum disulphide, molybdenum selenide, black phosphorus, indium antimonide, graphene, graphyne, borophene, germanene, silicene, Si2BN, stanene, phosphorene, molybdenite, poly- III-V like InAs, InGaAs, InP, amorphous InGaZnO (a-IGZO), crystal-like InGaZnO (c-IGZO), GaZnON, ZnON, or C-Axis Aligned Crystal (CAAC).

In embodiments, the insulator layer 121 may include metal interconnects, e.g., an interconnect 126, or an interconnect 128. The interconnect 126 may be coupled to the source electrode 113 by a via 122, and may be coupled to an electrode of the TFT 130 by a via 127. Similarly, the interconnect 128 may be coupled to the drain electrode 115 by a via 124, and may be coupled to an electrode of the TFT 130 by a via 129. The insulator layer 121 may be of a planar shape, and includes an oxide material. The insulator layer 121 may have a thickness in a range of about 10 nm to about 100 nm. The insulator layer 121 may be a part of the BEOL of the IC 100, which may be formed by a same process for making the TFT 110 and the TFT 130. For example, the TFT 110 may be within a metal layer n1 to a metal layer n2 of the BEOL, the insulator layer 121 may be above the metal layer n2, between a metal layer n3 to a metal layer n4 of the BEOL, while the TFT 130 may be above the metal layer n4 of the insulator layer 121.

In embodiments, the substrate 101 may be a silicon substrate, a glass substrate, such as soda lime glass or borosilicate glass, a metal substrate, a plastic substrate, or another suitable substrate. In addition to the dielectric layer 103, other dielectric layer or other devices may be formed on the substrate 101, not shown for clarity.

In embodiments, the dielectric layer 103, or the gate dielectric layer 107, may include a silicon oxide (SiO) film, a silicon nitride (SiN) film, $O_3$-tetraethylorthosilicate (TEOS), $O_3$-hexamethyldisiloxane (HMDS), plasma-TEOS oxide layer, or other suitable materials. For example, the gate dielectric layer 107 may include silicon and oxygen, silicon and nitrogen, yttrium and oxygen, silicon, oxygen, and nitrogen, aluminum and oxygen, hafnium and oxygen, tantalum and oxygen, or titanium and oxygen. For example, the gate dielectric layer 107 may include silicon oxide ($SiO_2$), silicon nitride ($SiN_x$), yttrium oxide ($Y_2O_3$), silicon oxynitride ($SiO_xN_y$), aluminum oxide ($Al_2O_3$), hafnium(IV) oxide ($HfO_2$), tantalum oxide ($T_2O_5$), titanium dioxide ($TiO_2$), or other materials.

In embodiments, the gate electrode 109, the source electrode 113, and the drain electrode 115, the interconnect 126, or the interconnect 128, may be formed as a single layer or a stacked layer using one or more conductive films including a conductive material. For example, the gate electrode 109, the source electrode 113, and the drain electrode 115, the interconnect 126, may include gold (Au), platinum (Pt), ruthenium (Ru), iridium (Ir), titanium (Ti), aluminum (Al), molybdenum (Mo), copper (Cu), tantalum (T), tungsten (W), nickel (Ni), chromium (Cr), hafnium (Hf), indium (In), or an alloy of Ti, Mo, Au, Pt, Al Ni, Cu, Cr, TiAlN, HfAlN, or InAlO. For example, the gate electrode 109, the source electrode 113, and the drain electrode 115, the interconnect 126, may include tantalum nitride (TaN), titanium nitride (TiN), iridium-tantalum alloy (Ir-T), indium-tin oxide (ITO), the like, and/or a combination thereof.

There may be additional components, e.g., a spacer, a passivation layer, included in the TFT 110 or the TFT 130, which are not shown in FIG. 1. For example, a spacer including a dielectric material, similar to a dielectric material for the dielectric layer 103 may be included in the TFT 110. The TFT 110 may also include a passivation layer having one or more materials capable of providing passivation, such as physical, chemical and/or electrical insulation, isolation, stability and/or separation between two or more other layers.

FIGS. 2(*a*)-2(*b*) schematically illustrates diagrams of another IC including a TFT stacked over another TFT, e.g., a TFT 230 stacked over a TFT 210, or a TFT 270 stacked over a TFT 250, in accordance with some embodiments. In embodiments, the TFT 210, the TFT 230, the TFT 250, and the TFT 270, may be similar to the TFT 110 or the TFT 130 shown in FIG. 1. Various other layers in the TFT 210, the TFT 230, the TFT 250, and the TFT 270 may be similar to corresponding layers in the TFT 110 or the TFT 130 in FIG. 1.

In embodiments, the TFT 230 may be stacked over the TFT 210. The TFT 210 may be above a substrate 201, an insulator layer 221 may be above the TFT 210, and the TFT 230 may be above the insulator layer 221. A dielectric layer 203 may be between the substrate 201 and the TFT 210. The TFT 210 may include a channel layer 205 above the substrate 201, a gate electrode 209 above the channel layer 205 and separated from the channel layer 205 by a gate dielectric 207. The TFT 210 may further include a source area 208 adjacent to the channel layer 205, a source electrode 213 above the source area 208, a drain area 206 adjacent to the channel layer 205, and a drain electrode 215 above the drain area 206. The source electrode 213, the drain electrode 215, and the gate electrode 209 may be embedded within an ILD layer 211.

The TFT 230 may include a channel layer 235 above the insulator layer 221, and a gate electrode 239 separated from the channel layer 235 by a gate dielectric layer 237. The gate electrode 239 may be below the channel layer 235 and above the insulator layer 221. The TFT 230 may further includes a source area 238 adjacent to the channel layer 235, a source electrode 243 above the source area 238, a drain area 236 adjacent to the channel layer 235, and a drain electrode 245 above the drain area 236. The source electrode 243, the drain electrode 245 may be embedded within an ILD layer 231.

The insulator layer 221 may be next to the source electrode 213, the drain electrode 215, and above the gate electrode 209. The insulator 221 may include other interconnects as shown in FIG. 1. Additionally and alternatively, the insulator 221 may not include any interconnect. The gate electrode 239 of the TFT 230 may be coupled with the gate electrode 209 of the TFT 210, by a via 229. The via 229 may be through the insulator layer 221 to couple the gate electrode 239 and the gate electrode 209.

In embodiments, the TFT 270 may be stacked over the TFT 250. The TFT 250 may be above a substrate 251, an insulator layer 271 may be above the TFT 250, and the TFT 270 may be above the insulator layer 271. A dielectric layer 253 may be between the substrate 251 and the TFT 250. The TFT 250 may include a channel layer 255 above the substrate 251, a gate electrode 259 above the channel layer 255 and separated from the channel layer 255 by a gate dielectric 257. The TFT 250 may further include a source area 258 adjacent to the channel layer 255, a source electrode 263 above the source area 258, a drain area 256 adjacent to the channel layer 255, and a drain electrode 265 above the drain area 256. The source electrode 263, the drain electrode 265, and the gate electrode 259 may be embedded within an ILD layer 261.

The TFT 270 may include a channel layer 275 above the insulator layer 271, and a gate electrode 279 separated from the channel layer 275 by a gate dielectric layer 277. The gate electrode 279 may be above the channel layer 275 and above the insulator layer 271. The TFT 270 may further includes a source area 278 adjacent to the channel layer 275, a source electrode 283 above the source area 278, a drain area 276 adjacent to the channel layer 275, and a drain electrode 285 above the drain area 276. The source electrode 283, the drain electrode 285 may be embedded within an ILD layer 281.

The insulator layer 271 may be next to the source electrode 263, the drain electrode 265, and above the gate electrode 259. The source electrode 283 may be coupled with the source electrode 263 through the insulator layer 271 by a via 287. Additionally and alternatively, the drain electrode 285 may be coupled with the drain electrode 265 through the insulator layer 271 by a via 289.

Figure 3:
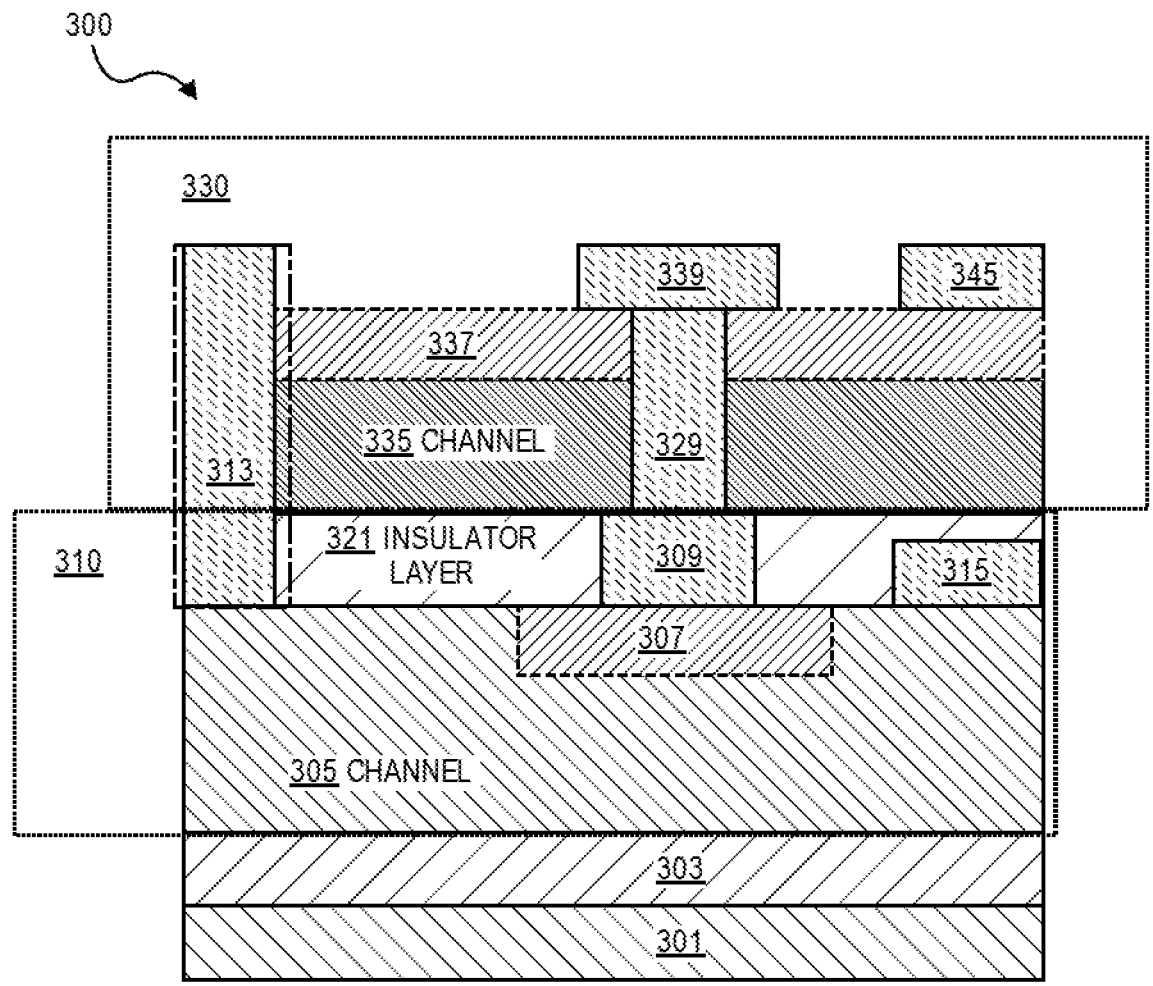
FIG. 3 schematically illustrates a diagram of another IC including a TFT stacked over another TFT, in accordance with some embodiments.

FIG. 3 schematically illustrates a diagram of another IC 300 including a TFT 330 stacked over another TFT 310, in accordance with some embodiments. In embodiments, the IC 300, the TFT 310, and the TFT 330 may be similar to the IC 100, the TFT 110, and the TFT 130 shown in FIG. 1.

In embodiments, the TFT 330 may be stacked over the TFT 310. The TFT 310 may be above a substrate 301, an insulator layer 321 may be above the TFT 310, and the TFT 330 may be above the insulator layer 321. A dielectric layer 303 may be between the substrate 301 and the TFT 310. The TFT 310 may include a channel layer 305 above the substrate 301, a gate electrode 309 above the channel layer 305 and separated from the channel layer 305 by a gate dielectric 307. The gate electrode 309 may be partially or completely embedded within the insulator layer 321. The TFT 310 may further include a source electrode 313 above the channel layer 305, and a drain electrode 315 above the channel layer 305.

The TFT 330 may include a channel layer 335 above the insulator layer 321, and a gate electrode 339 separated from the channel layer 335 by a gate dielectric layer 337. The gate electrode 339 may be above the channel layer 335 and above the insulator layer 321. The gate electrode 339 may be coupled to the gate electrode 309 by a via 329 wrapped around the channel layer 335 and through the insulator layer 321. FIG. 3 shows the via 329 across the channel area 335 to illustrate the via 329 is wrapped around the channel area 335. The source electrode 313 of the TFT 310 may be directly through the insulator layer 321 and act as a source electrode for the TFT 330. The TFT 330 may further includes a drain electrode 345 above the channel layer 335.

Figure 2A:
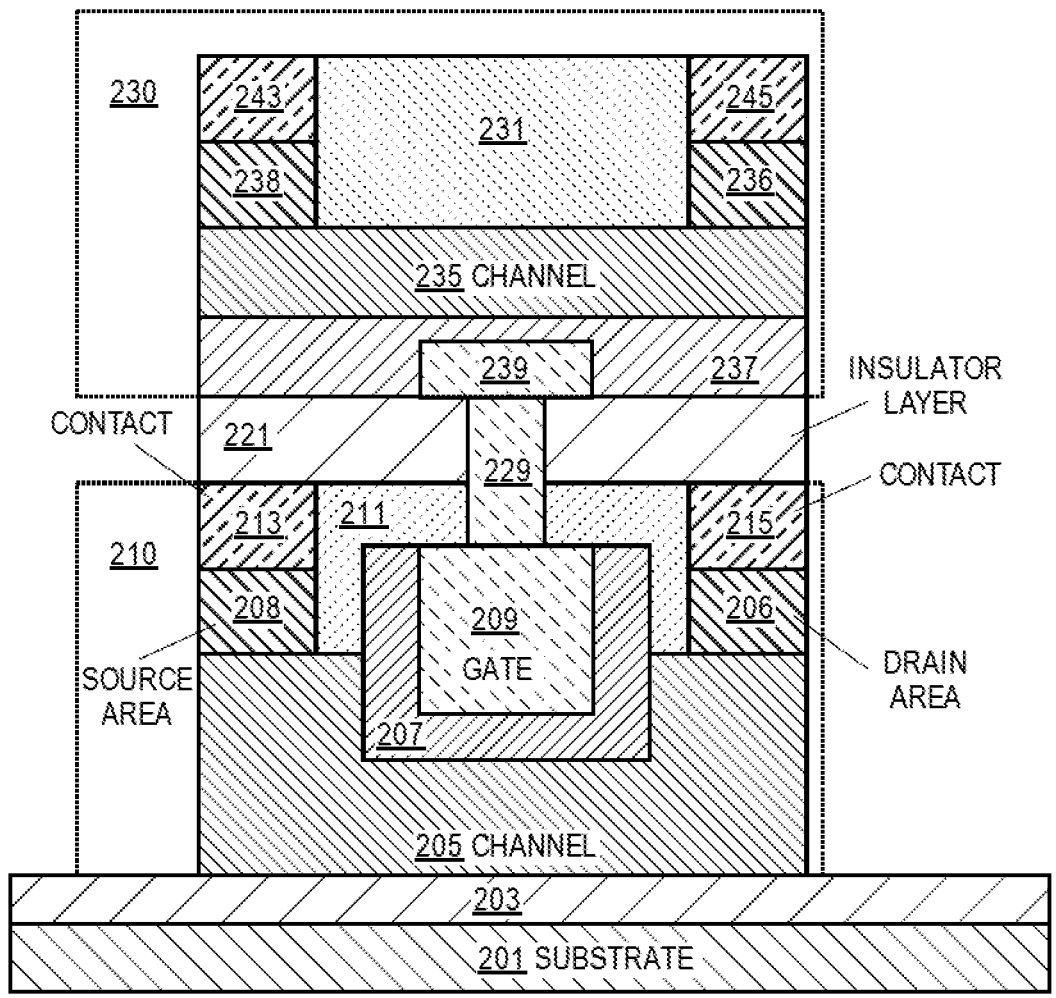
FIGS. 2(a)-2(b) schematically illustrate diagrams of another IC including a TFT stacked over another TFT, in accordance with some embodiments.
Figure 4:
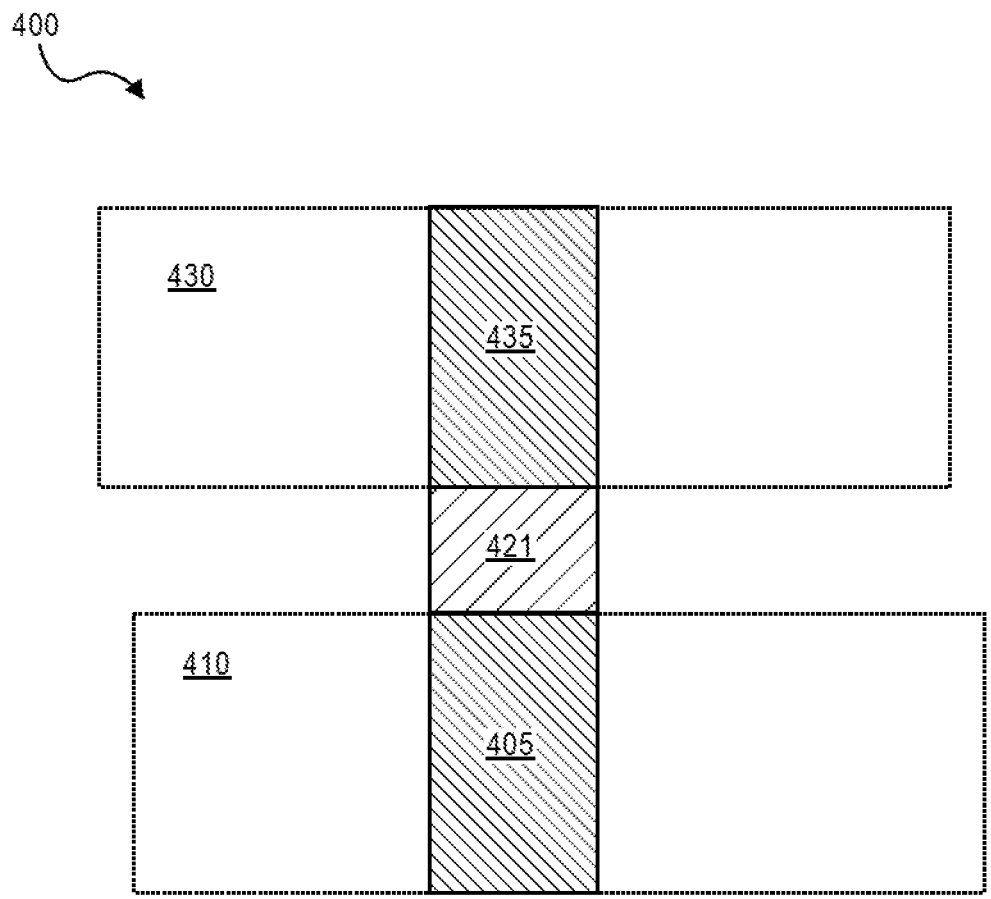
FIG. 4 schematically illustrates a diagram of an IC including a fin of a channel of a TFT, stacked over a fin of a channel of another TFT, in accordance with some embodiments.

FIG. 4 schematically illustrates a diagram of an IC 400 including a fin 435 of a channel of a TFT 430, stacked over a fin 405 of a channel of another TFT 410, in accordance with some embodiments. In embodiments, the IC 400, the TFT 410, and the TFT 430 may be similar to the IC 100, the TFT 110, and the TFT 130 as shown in FIG. 1. The fin 405 may be a part of the channel layer 205, and the fin 435 may be a part of the channel layer 235 as shown in FIG. 2(a).

In embodiments, the TFT 430 may be stacked over the TFT 410. The TFT 430 may be above an insulator layer 421, which may be above the TFT 410. The TFT 410 may be above a substrate, not shown. The TFT 410 may include a channel layer that includes the fin 405, and the TFT 430 may include a channel layer that includes the fin 435. The fin 435 may be separated from the fin 405 by the insulator layer 421.

There may be other components, such as a dielectric layer, a gate electrode, a gate dielectric, a source electrode, and a drain electrode for the TFT 410 or the TFT 430, not shown.

Figure 5:
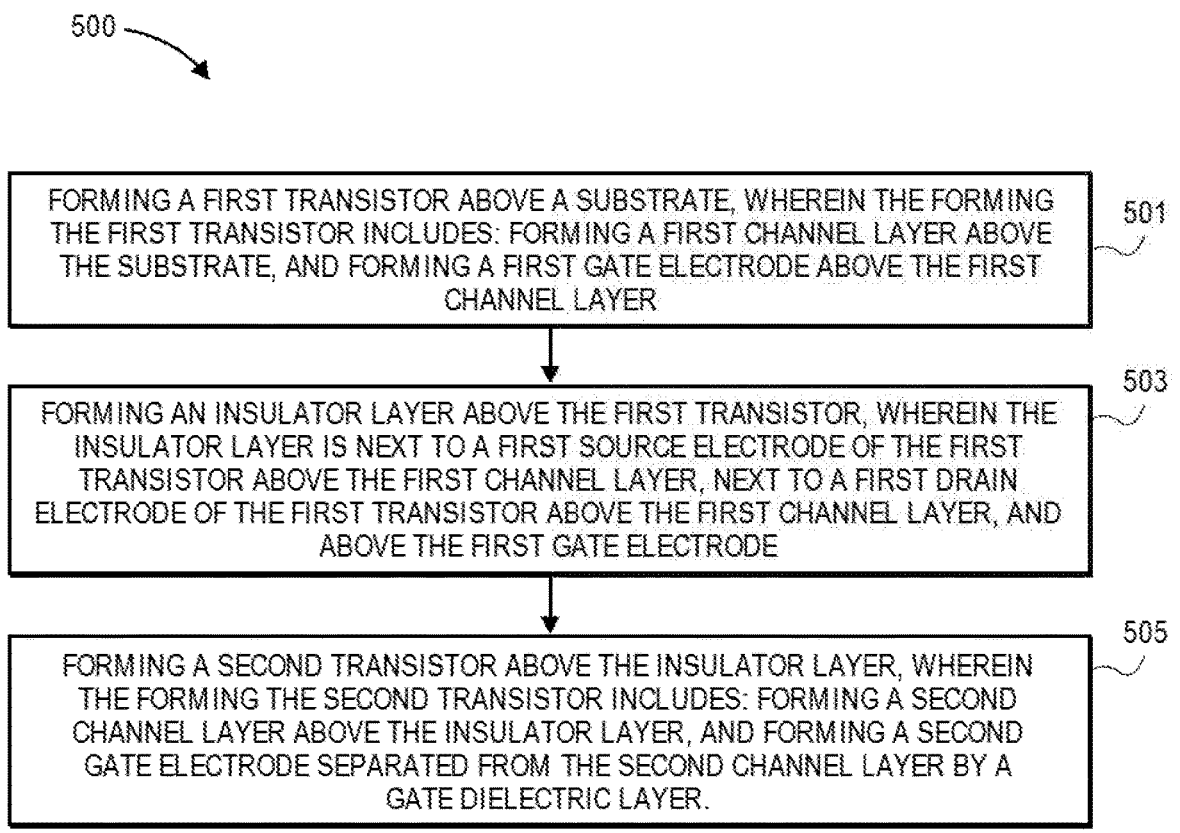
FIG. 5 illustrates a process for forming an IC including a TFT stacked over another TFT, in accordance with some embodiments.

FIG. 5 illustrates a process 500 for forming an IC including a TFT stacked over another TFT, in accordance with some embodiments. In embodiments, the process 500 may be applied to form the TFT 110 and the TFT 130 in FIG. 1, the TFT 210 and the TFT 230, or the TFT 250 and the TFT 270 in FIGS. 2(a)-2(b), the TFT 310 and the TFT 330 in FIG. 3, the TFT 410 and the TFT 430 in FIG. 4.

At block 501, the process 500 may include forming a first transistor above a substrate, wherein the forming the first transistor includes: forming a first channel layer above the substrate, and forming a first gate electrode above the first channel layer. For example, the process 500 may include forming the transistor 110 above the substrate 101, wherein the forming the transistor 110 includes: forming the channel layer 105 above the substrate 101, and forming the gate electrode 109 above the channel layer 105.

At block 503, the process 500 may include forming an insulator layer above the first transistor, wherein the insulator layer is next to a first source electrode of the first transistor above the first channel layer, next to a first drain electrode of the first transistor above the first channel layer, and above the first gate electrode. For example, the process 500 may include forming the insulator layer 121 above the TFT 110. The insulator layer 121 is next to the source electrode 113 of the TFT 110 above the channel layer 105. The insulator layer 121 is next to the drain electrode 115 of the TFT 110 above the channel layer 105. The insulator layer 121 is also above the gate electrode 109.

At block 505, the process 500 may include forming a second transistor above the insulator layer, wherein the forming the second transistor include forming a second channel layer above the insulator layer, and forming a second gate electrode separated from the second channel layer by a gate dielectric layer. For example, the process 500 may include forming the TFT 130 above the insulator layer 121, wherein the forming the TFT 130 include forming a channel layer above the insulator layer 121, and forming a gate electrode separated from the channel layer by a gate dielectric layer.

In embodiments, the process 500 may include one or more additional operations than those depicted by FIG. 5. For example, the process 500 may include forming the dielectric layer 103 between the substrate 101 and the TFT 110.

Figure 6:
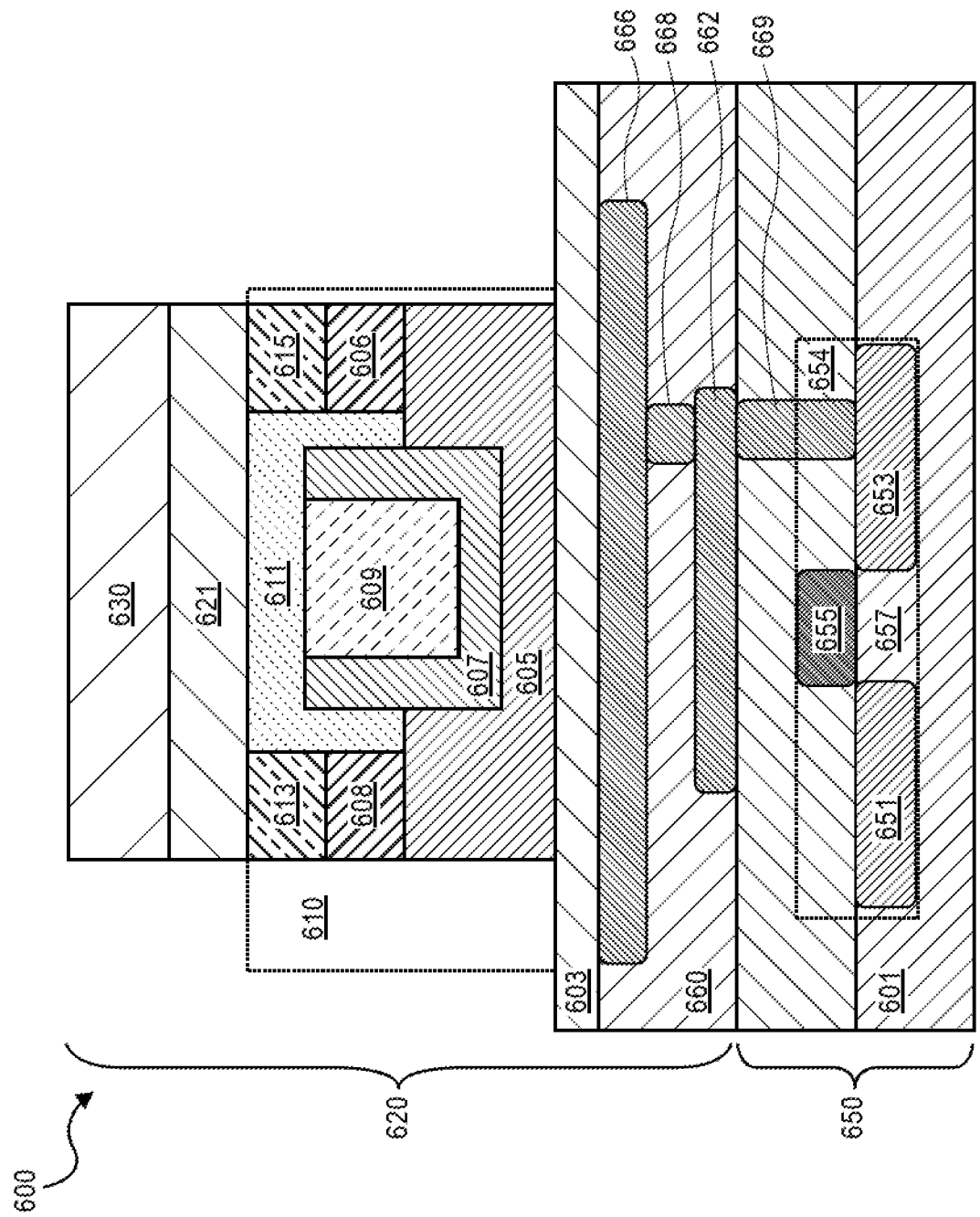
FIG. 6 schematically illustrates a diagram of an IC including of a TFT stacked over another TFT in back-end-of-line (BEOL) on a substrate, in accordance with some embodiments.

FIG. 6 schematically illustrates a diagram of an IC 600 including a TFT 630 stacked over another TFT 610 in back-end-of-line (BEOL) on a substrate, in accordance with some embodiments. In embodiments, the TFT 630 and the TFT 610 may be similar to the TFT 130 and the TFT 110 in FIG. 1, the TFT 230 and the TFT 210, or the TFT 270 and the TFT 250 in FIGS. 2(*a*)-2(*b*), the TFT 330 and the TFT 310 in FIG. 3, the TFT 430 and the TFT 410 in FIG. 4.

In embodiments, the TFT 610 is above the substrate 601, an insulator layer 621 above the TFT 610, and the TFT 630 above the insulator layer 621. A dielectric layer 603 may be between the substrate 601 and the TFT 610. The TFT 610 may include a channel layer 605 above the substrate 601, a gate electrode 609 above the channel layer 605 and separated from the channel layer 605 by a gate dielectric 607. The TFT 610 may further include a source area 608 adjacent to the channel layer 605, a source electrode 613 above the source area 608, a drain area 606 adjacent to the channel layer 605, and a drain electrode 615 above the drain area 606. The source electrode 613, the drain electrode 615, and the gate electrode 609 may be embedded within an ILD layer 611. The insulator layer 621 may be next to the source electrode 613, the drain electrode 615, and above the gate electrode 609. The TFT 630 may include a channel layer above the insulator layer 621, and a gate electrode separated from the channel layer by a gate dielectric layer, not shown. In embodiments, a shadow of the transistor TFT 630 may be substantially overlapped with the TFT 610.

In embodiments, the TFT 630 and the TFT 610 may be formed at the BEOL 620. In addition to the TFT 630 and the TFT 610, the BEOL 620 may further include a dielectric layer 660, where one or more vias, e.g., a via 668, may be connected to one or more interconnect, e.g., an interconnect 666, and an interconnect 662 within the dielectric layer 660. In embodiments, the interconnect 666 and the interconnect 662 may be of different metal layers at the BEOL 620. The dielectric layer 660 is shown for example only. The dielectric layer 660 may be separated from the TFT 610 by the dielectric layer 603. Although not shown by FIG. 6, in various embodiments there may be multiple dielectric layers included in the BEOL 620.

In embodiments, the BEOL 620 may be formed on the front-end-of-line (FEOL) 650. The FEOL 650 may include the substrate 601. In addition, the FEOL 650 may include other devices, e.g., a transistor 654. In embodiments, the transistor 654 may be a FEOL transistor, including a source 651, a drain 653, and a gate 655, with a channel 657 between the source 651 and the drain 653 under the gate 655. Furthermore, the transistor 654 may be coupled to interconnects, e.g., the interconnect 662, through a via 669.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

Figure 7:
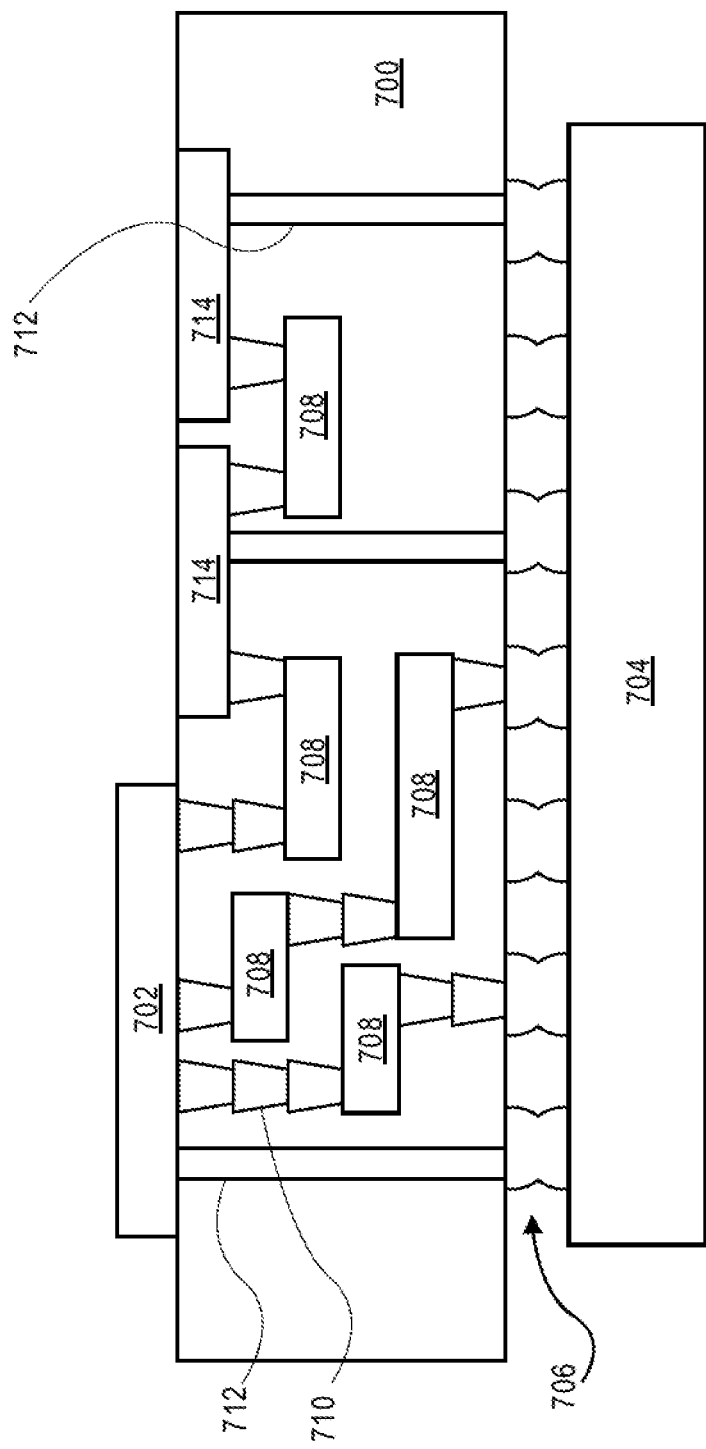
FIG. 7 schematically illustrates an interposer implementing one or more embodiments of the disclosure, in accordance with some embodiments.

FIG. 7 illustrates an interposer 700 that includes one or more embodiments of the disclosure. The interposer 700 is an intervening substrate used to bridge a first substrate 702 to a second substrate 704. The first substrate 702 may be, for instance, a substrate support for a TFT, e.g., the TFT 110 and the TFT 130 in FIG. 1, the TFT 210 and the TFT 230, or the TFT 250 and the TFT 270 in FIGS. 2(*a*)-2(*b*), the TFT 310 and the TFT 330 in FIG. 3, the TFT 410 and the TFT 430 in FIG. 4, the TFT 610 and the TFT 630 in FIG. 6, and the first transistor and the second transistor produced by the process 500. The second substrate 704 may be, for instance, a memory module, a computer motherboard, or another integrated circuit die. For example, the second substrate 704 may be a memory module including the memory array 100 as shown in FIG. 1. Generally, the purpose of an interposer 700 is to spread a connection to a wider pitch or to reroute a connection to a different connection. For example, an interposer 700 may couple an integrated circuit die to a ball grid array (BGA) 706 that can subsequently be coupled to the second substrate 704. In some embodiments, the first and second substrates 702/704 are attached to opposing sides of the interposer 700. In other embodiments, the first and second substrates 702/704 are attached to the same side of the interposer 700. And in further embodiments, three or more substrates are interconnected by way of the interposer 700.

The interposer 700 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 708 and vias 710, including but not limited to through-silicon vias (TSVs) 712. The interposer 700 may further include embedded devices 714, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 700.

In accordance with embodiments of the disclosure, apparatuses or processes disclosed herein may be used in the fabrication of interposer 700.

Figure 8:
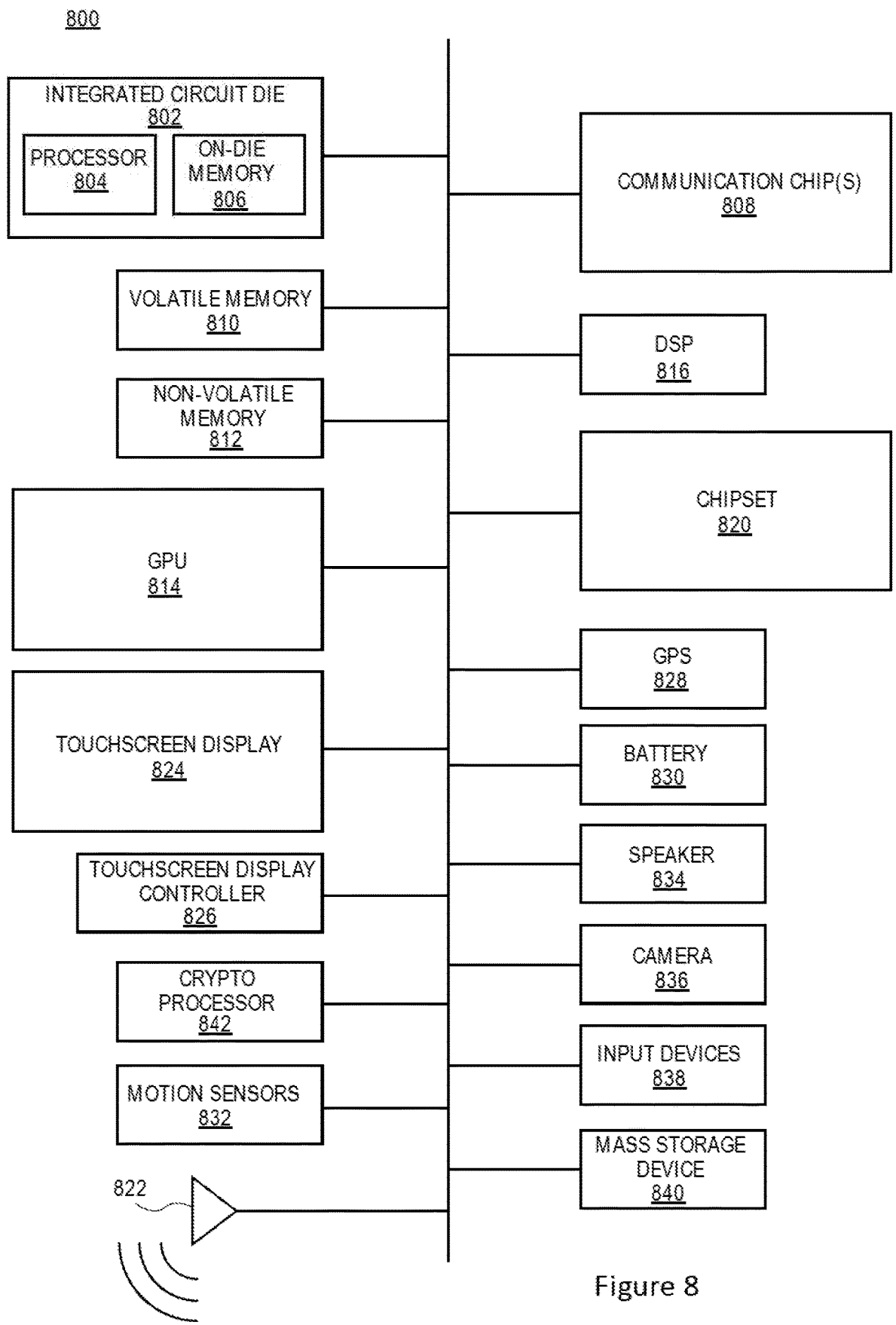
FIG. 8 schematically illustrates a computing device built in accordance with an embodiment of the disclosure, in accordance with some embodiments.

FIG. 8 illustrates a computing device 800 in accordance with one embodiment of the disclosure. The computing device 800 may include a number of components. In one embodiment, these components are attached to one or more motherboards. In an alternate embodiment, some or all of these components are fabricated onto a single system-on-a-chip (SoC) die, such as a SoC used for mobile devices. The components in the computing device 800 include, but are not limited to, an integrated circuit die 802 and at least one communications logic unit 808. In some implementations the communications logic unit 808 is fabricated within the integrated circuit die 802 while in other implementations the communications logic unit 808 is fabricated in a separate integrated circuit chip that may be bonded to a substrate or motherboard that is shared with or electronically coupled to the integrated circuit die 802. The integrated circuit die 802 may include a processor 804 as well as on-die memory 806, often used as cache memory, which can be provided by technologies such as embedded DRAM (eDRAM), or SRAM. For example, the on-die memory 806 may include the TFT 110 and the TFT 130 in FIG. 1, the TFT 210 and the TFT 230, or the TFT 250 and the TFT 270 in FIGS. 2(*a*)-2(*b*), the TFT 310 and the TFT 330 in FIG. 3, the TFT 410 and the TFT 430 in FIG. 4, the TFT 610 and the TFT 630 in FIG. 6, and the first transistor and the second transistor produced by the process 500.

In embodiments, the computing device 800 may include a display or a touchscreen display 824, and a touchscreen display controller 826. A display or the touchscreen display 824 may include a FPD, an AMOLED display, a TFT LCD, a micro light-emitting diode (μLED) display, or others. For example, the touchscreen display 824 may include the TFT 110 and the TFT 130 in FIG. 1, the TFT 210 and the TFT 230, or the TFT 250 and the TFT 270 in FIGS. 2(a)-2(b), the TFT 310 and the TFT 330 in FIG. 3, the TFT 410 and the TFT 430 in FIG. 4, the TFT 610 and the TFT 630 in FIG. 6, and the first transistor and the second transistor produced by the process 500.

Computing device 800 may include other components that may or may not be physically and electrically coupled to the motherboard or fabricated within a SoC die. These other components include, but are not limited to, volatile memory 810 (e.g., dynamic random access memory (DRAM), non-volatile memory 812 (e.g., ROM or flash memory), a graphics processing unit 814 (GPU), a digital signal processor (DSP) 816, a crypto processor 842 (e.g., a specialized processor that executes cryptographic algorithms within hardware), a chipset 820, at least one antenna 822 (in some implementations two or more antenna may be used), a battery 830 or other power source, a power amplifier (not shown), a voltage regulator (not shown), a global positioning system (GPS) device 828, a compass, a motion coprocessor or sensors 832 (that may include an accelerometer, a gyroscope, and a compass), a microphone (not shown), a speaker 834, a camera 836, user input devices 838 (such as a keyboard, mouse, stylus, and touchpad), and a mass storage device 840 (such as hard disk drive, compact disk (CD), digital versatile disk (DVD), and so forth). The computing device 800 may incorporate further transmission, telecommunication, or radio functionality not already described herein. In some implementations, the computing device 800 includes a radio that is used to communicate over a distance by modulating and radiating electromagnetic waves in air or space. In further implementations, the computing device 800 includes a transmitter and a receiver (or a transceiver) that is used to communicate over a distance by modulating and radiating electromagnetic waves in air or space.

The communications logic unit 808 enables wireless communications for the transfer of data to and from the computing device 800. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communications logic unit 808 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Infrared (IR), Near Field Communication (NFC), Bluetooth, derivatives thereof, as well as any other wireless protocols that are designated as 3G, 4G, 5G, and beyond. The computing device 800 may include a plurality of communications logic units 808. For instance, a first communications logic unit 808 may be dedicated to shorter range wireless communications such as Wi-Fi, NFC, and Bluetooth and a second communications logic unit 808 may be dedicated to longer range wireless communications such as GPS, EDGE, GPRS, CDMA, WiMAX, LTE, Ev-DO, and others.

The processor 804 of the computing device 800 includes one or more devices, such as transistors. The term "processor" may refer to any device or portion of a device that processes electronic data from registers and/or memory to transform that electronic data into other electronic data that may be stored in registers and/or memory. The communications logic unit 808 may also include one or more devices, such as transistors.

Figure 2B:
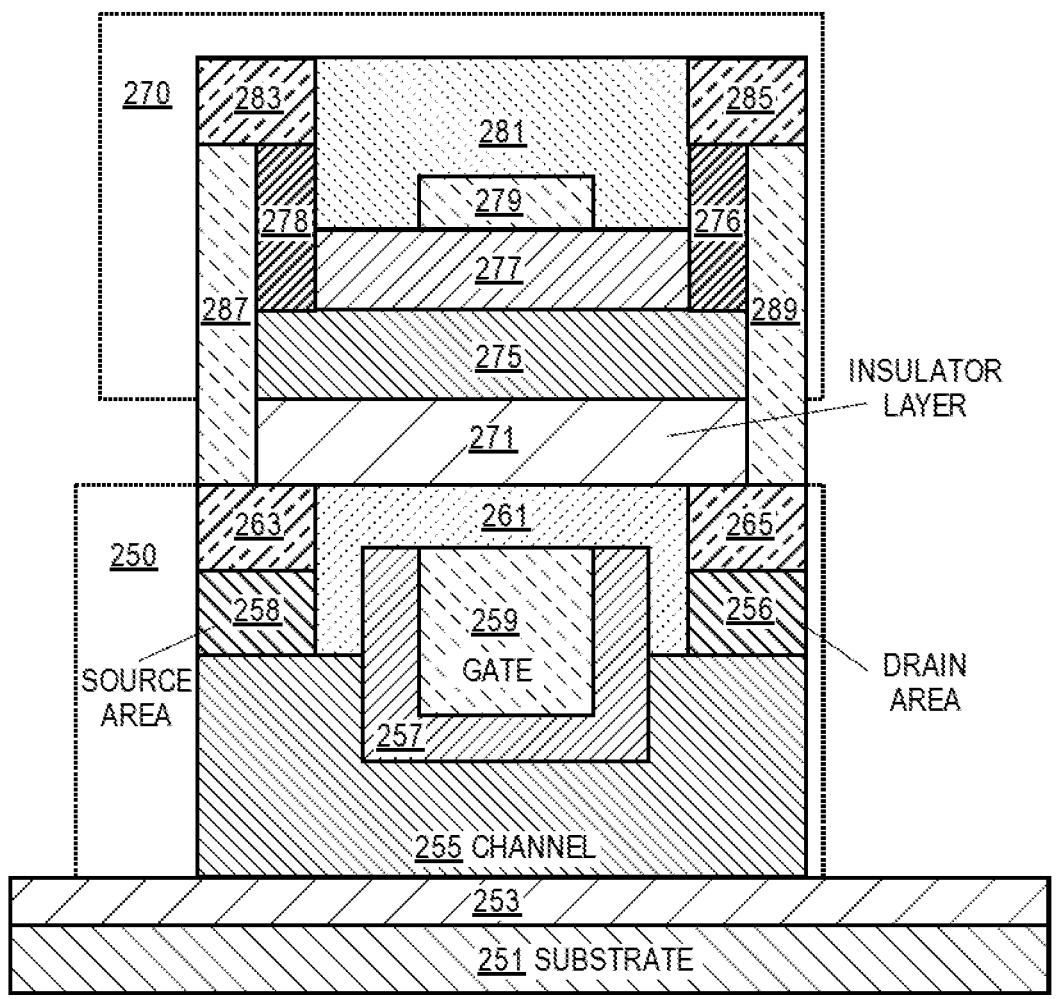

In further embodiments, another component housed within the computing device 800 may contain one or more devices, such as DRAM, that are formed in accordance with implementations of the current disclosure, e.g., the TFT 110 and the TFT 130 in FIG. 1, the TFT 210 and the TFT 230, or the TFT 250 and the TFT 270 in FIGS. 2(a)-2(b), the TFT 310 and the TFT 330 in FIG. 3, the TFT 410 and the TFT 430 in FIG. 4, the TFT 610 and the TFT 630 in FIG. 6, and the first transistor and the second transistor produced by the process 500.

In various embodiments, the computing device 800 may be a laptop computer, a netbook computer, a notebook computer, an ultrabook computer, a smartphone, a dumbphone, a tablet, a tablet/laptop hybrid, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 800 may be any other electronic device that processes data.

Some Non-Limiting Examples are Provided Below.

Example 1 may include an integrated circuit (IC), comprising: a first transistor above a substrate, wherein the first transistor includes: a first channel layer above the substrate, and a first gate electrode above the first channel layer; an insulator layer above the first transistor, wherein the insulator layer is next to a first source electrode of the first transistor above the first channel layer, next to a first drain electrode of the first transistor above the first channel layer, and above the first gate electrode; and a second transistor above the insulator layer, wherein the second transistor includes: a second channel layer above the insulator layer, and a second gate electrode separated from the second channel layer by a gate dielectric layer.

Example 2 may include the integrated circuit of example 1 and/or some other examples herein, wherein the second gate electrode is below the second channel layer and above the insulator layer.

Example 3 may include the integrated circuit of example 1 and/or some other examples herein, wherein the insulator layer includes a metal interconnect.

Example 4 may include the integrated circuit of example 1 and/or some other examples herein, wherein the second transistor further includes a second source electrode next to a second source area above the second channel layer, and the second source electrode is coupled with the first source electrode.

Example 5 may include the integrated circuit of example 1 and/or some other examples herein, wherein the second transistor further includes a second drain electrode next to a second drain area above the second channel layer, and the second drain electrode is coupled with the first drain electrode.

Example 6 may include the integrated circuit of example 1 and/or some other examples herein, wherein the second gate electrode is coupled with the first gate electrode.

Example 7 may include the integrated circuit of example 1 and/or some other examples herein, wherein the first transistor or the second transistor is a p-type transistor, and includes a material selected from the group consisting of $CuO$, $ZnRh_2O_4$, $AlCuO_2$, $SrCu_2O_2$, $La_2SeO_2$, $Pr_2SeO_2$, $Nd_2SeO_2$, $Gd_2SeO_2$, $NiO$, $SiC$, $SnO$, $Cu_2O$, $VO_2$, and an oxide alloyed or doped with S or Se or Te or an element to raise a valence-band of the oxide to be a doped p-type oxide.

Example 8 may include the integrated circuit of example 1 and/or some other examples herein, wherein the first transistor or the second transistor is an n-type transistor, and includes a material selected from the group consisting of ZnO, CdO, In2O3, Ga$_2$O$_3$, SnO$_2$, IGZO, IZO, ITO, GZO, TiO$_2$, SiC, SnO, Cu$_2$O, or VO$_2$, and an oxide alloyed or doped with In, Sn, Zn, Mo, Ti, Co, or Cd, to lower a conduction band of the oxide to be a doped n-type oxide.

Example 9 may include the integrated circuit of example 1 and/or some other examples herein, wherein the first channel layer includes a first fin, the second channel layer includes a second fin, and the first fin is separated from the second fin by the insulator layer.

Example 10 may include the integrated circuit of example 1 and/or some other examples herein, wherein the insulator layer is of a planar shape, and includes an oxide material.

Example 11 may include the integrated circuit of example 1 and/or some other examples herein, wherein the insulator layer has a thickness in a range of about 10 nm to about 100 nm.

Example 12 may include the integrated circuit of example 1 and/or some other examples herein, wherein the first gate electrode is partially embedded within the insulator layer.

Example 13 may include the integrated circuit of example 1 and/or some other examples herein, wherein the first source electrode or the first drain electrode is directly through the insulator layer and act as a second source electrode or a second drain electrode for the second transistor.

Example 14 may include the integrated circuit of example 1 and/or some other examples herein, wherein a shadow of the second transistor is substantially overlapped with the first transistor.

Example 15 may include the integrated circuit of example 1 and/or some other examples herein, wherein the first gate electrode or the second gate electrode includes a material selected from the group consisting of Ti, W, molybdenum (Mo), gold (Au), platinum (Pt), aluminum (Al), nickel (Ni), copper (Cu), chromium (Cr), hafnium (Hf), indium (In), and an alloy of Ti, W, Mo, Au, Pt, Al, Ni, Cu, Cr, TiAlN, HfAlN, or InAlO.

Example 16 may a method for forming an integrated circuit, the method comprising: forming a first transistor above a substrate, wherein the forming the first transistor includes: forming a first channel layer above the substrate, and forming a first gate electrode above the first channel layer; forming an insulator layer above the first transistor, wherein the insulator layer is next to a first source electrode of the first transistor above the first channel layer, next to a first drain electrode of the first transistor above the first channel layer, and above the first gate electrode; and forming a second transistor above the insulator layer, wherein the forming the second transistor includes: forming a second channel layer above the insulator layer, and forming a second gate electrode separated from the second channel layer by a gate dielectric layer.

Example 17 may include the method of example 16 and/or some other examples herein, wherein the forming the second transistor further includes forming a second source electrode next to a second source area above the second channel layer, and the second source electrode is coupled with the first source electrode.

Example 18 may include the method of example 16 and/or some other examples herein, wherein the forming the second transistor further includes forming a second drain electrode next to a second drain area above the insulator layer, and the second drain electrode is coupled with the first drain electrode.

Example 19 may include the method of example 16 and/or some other examples herein, wherein the second gate electrode is coupled with the first gate electrode.

Example 20 may include the method of example 16 and/or some other examples herein, wherein the insulator layer is of a planar shape, and includes an oxide material.

Example 21 may include a computing device, comprising: a circuit board; and an integrated circuit (IC) coupled to the circuit board, wherein the IC includes: a first transistor above a substrate, wherein the first transistor includes: a first channel layer above the substrate, and a first gate electrode above the first channel layer; an insulator layer above the first transistor, wherein the insulator layer is next to a first source electrode of the first transistor above the first channel layer, next to a first drain electrode of the first transistor above the first channel layer, and above the first gate electrode; and a second transistor above the insulator layer, wherein the second transistor includes: a second channel layer above the insulator layer, and a second gate electrode separated from the second channel layer by a gate dielectric layer.

Example 22 may include the computing device of example 21 and/or some other examples herein, wherein the first transistor or the second transistor is a p-type transistor, and includes a material selected from the group consisting of CuO, ZnRh$_2$O$_4$, AlCuO$_2$, SrCu$_2$O$_2$, La$_2$SeO$_2$, Pr$_2$SeO$_2$, Nd$_2$SeO$_2$, Gd$_2$SeO$_2$, NiO, SiC, SnO, Cu$_2$O, or VO$_2$, and an oxide alloyed or doped with S, Se, Te, or an element to raise a valence-band of the oxide to be a doped p-type oxide.

Example 23 may include the computing device of example 21 and/or some other examples herein, wherein the first transistor or the second transistor is an n-type transistor, and includes a material selected from the group consisting of ZnO, CdO, In$_2$O$_3$, Ga$_2$O$_3$, SnO$_2$, IGZO, IZO, ITO, GZO, TiO$_2$, SiC, SnO, Cu$_2$O, or VO$_2$, and an oxide alloyed or doped with In, Sn, Zn, Mo, Ti, Co, or Cd, to lower a conduction band of the oxide to be a doped n-type oxide.

Example 24 may include the computing device of example 21 and/or some other examples herein, wherein the insulator layer is of a planar shape, and includes an oxide material.

Example 25 may include the computing device of example 21 and/or some other examples herein, wherein the computing device is a device selected from the group consisting of a wearable device or a mobile computing device, the wearable device or the mobile computing device including one or more of an antenna, a touchscreen controller, a display, a battery, a processor, an audio codec, a video codec, a power amplifier, a global positioning system (GPS) device, a compass, a Geiger counter, an accelerometer, a gyroscope, a speaker, and a camera coupled with the memory device.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. An integrated circuit (IC), comprising:
   a first transistor above a substrate, wherein the first transistor includes:
      a first channel layer above the substrate, and
      a first gate electrode above the first channel layer, wherein the first channel layer is not associated with a bottom gate electrode;
   an insulator layer above the first transistor, wherein the insulator layer is next to a first source electrode of the first transistor above the first channel layer, next to a first drain electrode of the first transistor above the first channel layer, and above the first gate electrode; and
   a second transistor above the insulator layer, wherein the second transistor includes:
      a second channel layer above the insulator layer, and
      a second gate electrode separated from the second channel layer by a gate dielectric layer.

2. The integrated circuit of claim 1, wherein the second gate electrode is below the second channel layer and above the insulator layer.

3. The integrated circuit of claim 1, wherein the insulator layer includes a metal interconnect.

4. The integrated circuit of claim 1, wherein the second transistor further includes a second source electrode next to a second source area above the second channel layer, and the second source electrode is coupled with the first source electrode.

5. The integrated circuit of claim 1, wherein the second transistor further includes a second drain electrode next to a second drain area above the second channel layer, and the second drain electrode is coupled with the first drain electrode.

6. The integrated circuit of claim 1, wherein the second gate electrode is coupled with the first gate electrode.

7. The integrated circuit of claim 1, wherein the first transistor or the second transistor is a p-type transistor, and includes a material selected from the group consisting of CuO, $ZnRh_2O_4$, $AlCuO_2$, $SrCu_2O_2$, $La_2SeO_2$, $Pr_2SeO_2$, $Nd_2SeO_2$, $Gd_2SeO_2$, NiO, SiC, SnO, $Cu_2O$, $VO_2$, and an oxide alloyed or doped with S or Se or Te or an element to raise a valence-band of the oxide to be a doped p-type oxide.

8. The integrated circuit of claim 1, wherein the first transistor or the second transistor is an n-type transistor, and includes a material selected from the group consisting of ZnO, CdO, $In_2O_3$, $Ga_2O_3$, $SnO_2$, IGZO, IZO, ITO, GZO, $TiO_2$, SiC, SnO, $Cu_2O$, or $VO_2$, and an oxide alloyed or doped with In, Sn, Zn, Mo, Ti, Co, or Cd, to lower a conduction band of the oxide to be a doped n-type oxide.

9. The integrated circuit of claim 1, wherein the first channel layer includes a first fin, the second channel layer includes a second fin, and the first fin is separated from the second fin by the insulator layer.

10. The integrated circuit of claim 1, wherein the insulator layer is of a planar shape, and includes an oxide material.

11. The integrated circuit of claim 1, wherein the insulator layer has a thickness in a range of about 10 nm to about 100 nm.

12. The integrated circuit of claim 1, wherein the first gate electrode is partially embedded within the insulator layer.

13. The integrated circuit of claim 1, wherein the first source electrode or the first drain electrode is directly through the insulator layer and act as a second source electrode or a second drain electrode for the second transistor.

14. The integrated circuit of claim 1, wherein a shadow of the second transistor is substantially overlapped with the first transistor.

15. The integrated circuit of claim 1, wherein the first gate electrode or the second gate electrode includes a material selected from the group consisting of Ti, W, molybdenum (Mo), gold (Au), platinum (Pt), aluminum (Al), nickel (Ni), copper (Cu), chromium (Cr), hafnium (Hf), indium (In), and an alloy of Ti, W, Mo, Au, Pt, Al, Ni, Cu, Cr, TiAlN, HfAlN, or InAlO.

16. A computing device, comprising:
   a circuit board; and
   an integrated circuit (IC) coupled to the circuit board, wherein the IC includes:
      a first transistor above a substrate, wherein the first transistor includes:
         a first channel layer above the substrate, and
         a first gate electrode above the first channel layer, wherein the first channel layer is not associated with a bottom gate electrode;
      an insulator layer above the first transistor, wherein the insulator layer is next to a first source electrode of the first transistor above the first channel layer, next to a first drain electrode of the first transistor above the first channel layer, and above the first gate electrode; and
      a second transistor above the insulator layer, wherein the second transistor includes:
         a second channel layer above the insulator layer, and
         a second gate electrode separated from the second channel layer by a gate dielectric layer.

17. The computing device of claim 16, wherein the first transistor or the second transistor is a p-type transistor, and includes a material selected from the group consisting of CuO, $ZnRh_2O_4$, $AlCuO_2$, $SrCu_2O_2$, $La_2SeO_2$, $Pr_2SeO_2$, $Nd_2SeO_2$, $Gd_2SeO_2$, NiO, SiC, SnO, $Cu_2O$, $VO_2$, and an oxide alloyed or doped with S, Se, Te, or an element to raise a valence-band of the oxide to be a doped p-type oxide.

18. The computing device of claim 16, wherein the first transistor or the second transistor is an n-type transistor, and includes a material selected from the group consisting of ZnO, CdO, $In_2O_3$, $Ga_2O_3$, $SnO_2$, IGZO, IZO, ITO, GZO, $TiO_2$, SiC, SnO, $Cu_2O$, or $VO_2$, and an oxide alloyed or doped with In, Sn, Zn, Mo, Ti, Co, or Cd, to lower a conduction band of the oxide to be a doped n-type oxide.

19. The computing device of claim 16, wherein the insulator layer is of a planar shape, and includes an oxide material.

20. The computing device of claim 16, wherein the computing device is a device selected from the group consisting of a wearable device or a mobile computing device, the wearable device or the mobile computing device including one or more of an antenna, a touchscreen controller, a display, a battery, a processor, an audio codec, a video codec, a power amplifier, a global positioning system (GPS) device, a compass, a Geiger counter, an accelerometer, a gyroscope, a speaker, and a camera coupled with the memory device.

* * * * *